United States Patent [19]

Shimose et al.

[11] Patent Number: 5,336,385

[45] Date of Patent: Aug. 9, 1994

[54] SPUTTERING APPARATUS

[75] Inventors: Yuichiro Shimose, Tokyo; Jiro Ikeda, Fujieda, both of Japan

[73] Assignees: Tokuda Seisakusho Co, Ltd.; Sony Corporation, both of Japan

[21] Appl. No.: 3,860

[22] Filed: Jan. 8, 1993

Related U.S. Application Data

[63] Continuation of Ser. No. 767,400, Sep. 30, 1991, abandoned.

[30] Foreign Application Priority Data

Jan. 30, 1991 [JP] Japan .................. 3-029431

[51] Int. Cl.⁵ ............................................. C23C 14/34
[52] U.S. Cl. .......................... 204/298.03; 204/192.13; 204/298.25
[58] Field of Search ............... 204/192.13, 298.03, 204/192.38, 298.41, 298.25

[56] References Cited

U.S. PATENT DOCUMENTS

| | | | |
|---|---|---|---|
| 4,379,743 | 4/1983 | Nakatsukasa et al. | 204/298.03 |
| 4,500,408 | 2/1985 | Boys et al. | 204/298.03 |
| 4,648,952 | 3/1987 | Savov et al. | 204/298.03 X |
| 4,663,009 | 5/1987 | Bloomquist et al. | 204/298.25 X |
| 4,749,465 | 6/1988 | Flint et al. | 204/298.25 |
| 4,849,087 | 7/1989 | Meyer et al. | 204/298.03 |
| 4,858,556 | 8/1989 | Siebert | 204/298.03 X |
| 4,894,133 | 1/1990 | Hedgcoth | 204/298.25 X |

FOREIGN PATENT DOCUMENTS 2205675 8/1990 Japan .................. 204/298.03

Primary Examiner—Nam Nguyen
Attorney, Agent, or Firm—Wigman, Cohen, Leitner & Myers

[57] ABSTRACT

An improved sputtering apparatus is provided which can judge whether or not a normal thin film has been satisfactorily deposited on the surface of a substrate to be processed in a film deposition apparatus. The judgment is made immediately after the sputtering process on the basis of the detection results of the pressure in a vacuum chamber and the waveform of discharge output power supplied from a discharge power source. The improvement comprises necessary condition-determining means for determining conditions necessary for depositing a normal thin film on the surface of the substrate to be processed, executed result-detecting means for detecting the results of a thin film deposition process, comparing means for comparing the executed results detected by the executed result-detecting means with the necessary conditions determined by the necessary condition-determining means, and judging means for judging whether or not the thin film-deposition process has been satisfactorily performed on the basis of the comparison results produced from the comparing means. Further, when the improved sputtering apparatus of this invention is employed in the continuous manufacturing line, the abnormalities in the film deposition process can be detected at the earlist possible step in the line, whereby the efficiency thereof can be significantly enhanced.

12 Claims, 8 Drawing Sheets

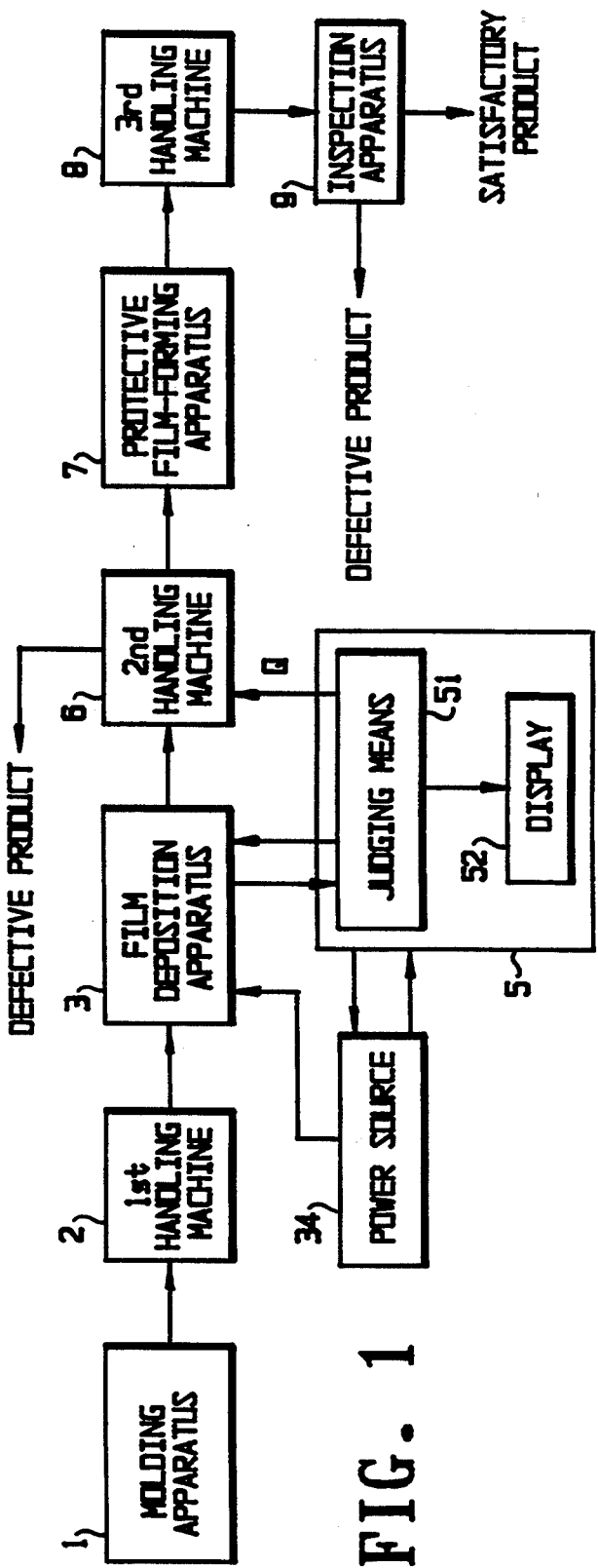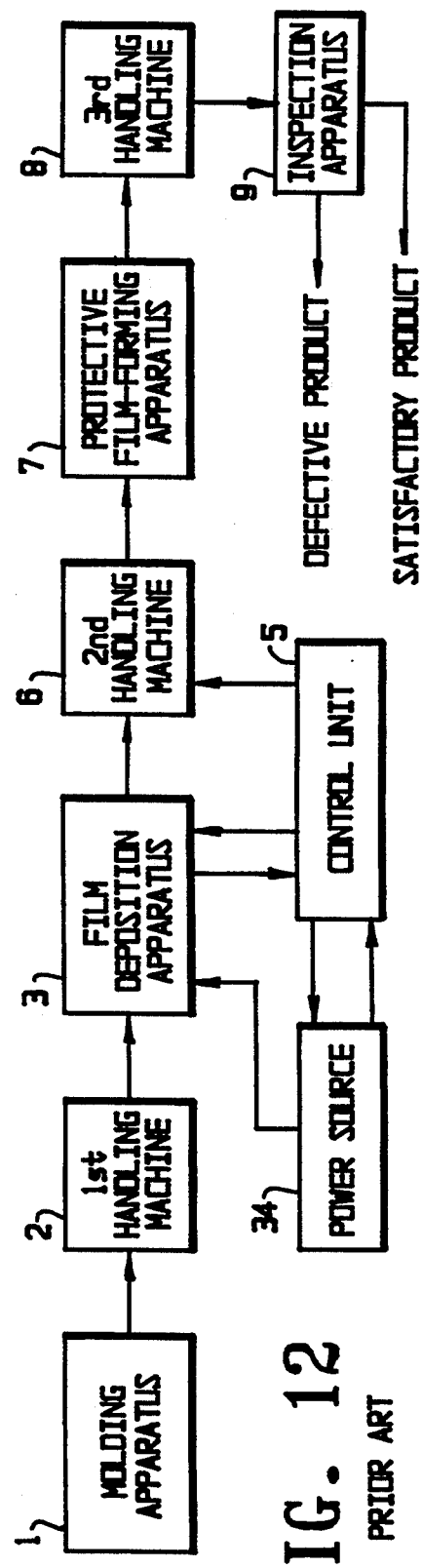
FIG. 1
FIG. 12 PRIOR ART

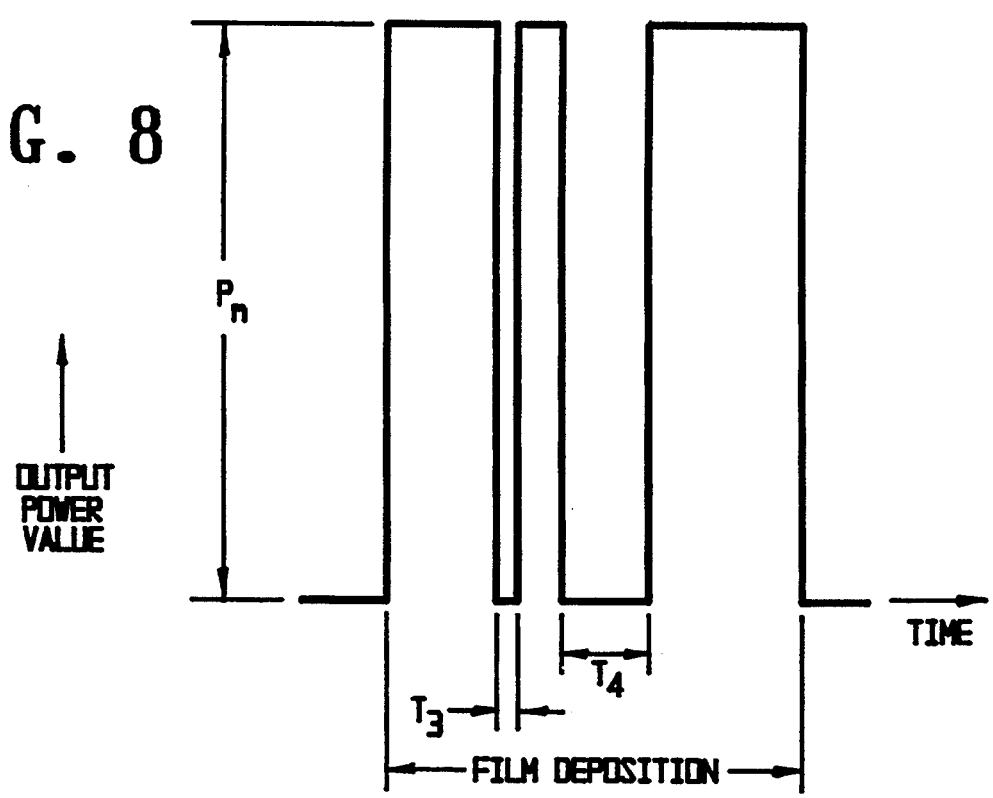
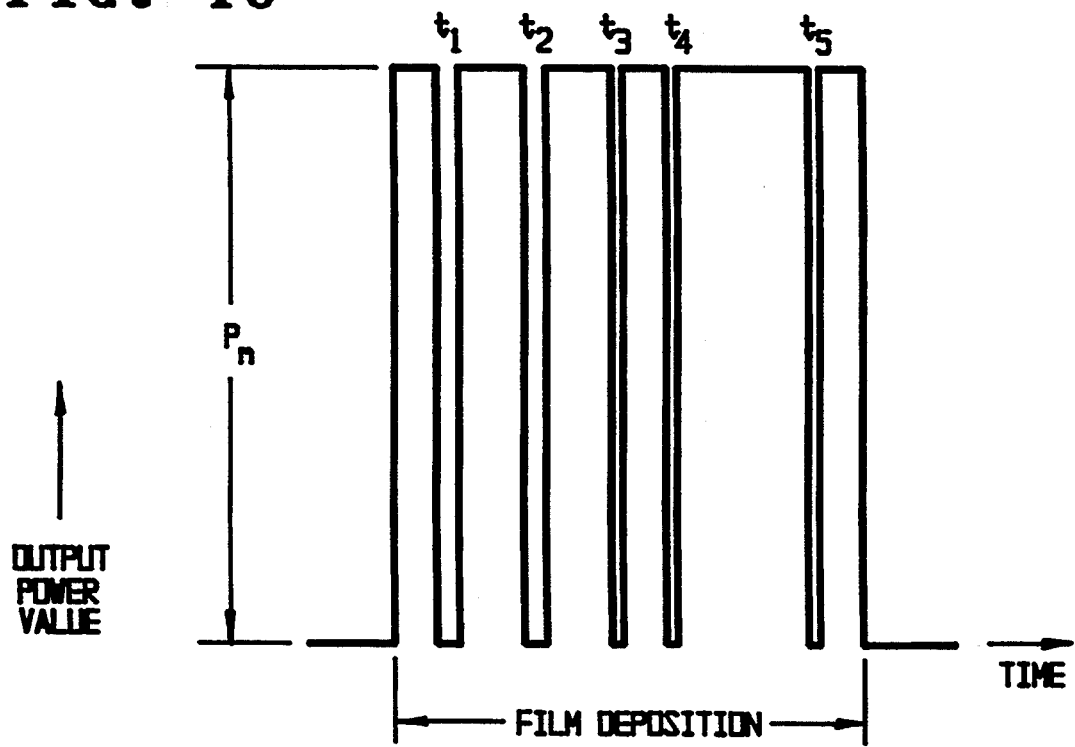

SPUTTERING APPARATUS

This is a continuation of co-pending application Ser. No. 07/767,400 filed on Sep. 30, 1991 abandoned.

BACKGROUND OF THE INVENTION

1. Field of the Invention

This invention relates to a sputtering apparatus, and more particularly to a sputtering apparatus that can judge whether or not a prescribed film deposition process has been satisfactorily performed on the basis of the detection results of the abnormalities in the sputtering process.

2. Description of the Prior Art

In recent years, a compact disk (hereinafter referred to as a CD) and a laser disk have been widely used to record a large amount of digitized sound and image information. The substrate of the CD is made of transparent synthetic resin such as polycarbonate and the like. A large number of so-called pits are formed on the surface of the substrate in accordance with digital information of "1" or "0". Further, an aluminum thin film having a high light-reflectivity is deposited on the pits-formed surface of the substrate by use of a sputtering technique. The thus recorded information can be read by the presence or absence of the reflected light of a laser light beam applied to the CD. The aluminum thin film deposition pep a single sheet of the substrate can be performed in a relatively short time. Thus, the continuous film deposition process with respect to a large number of substrates can be achieved.

A conventional sputtering apparatus generally has a configuration shown in FIG. 12 and FIG. 13. Specifically, digital information of "1" or "0" is recorded on the substrate by use of a press-molding technique, which is performed in a molding apparatus 1. The information-recorded substrate 4 is transferred by a first handling machine 2 into a film deposition apparatus 3, which has a configuration shown in FIG. 13. In FIG. 13, a light-reflecting film is deposited on the surface of the thus transferred substrate 4 in a film deposition chamber 31 (which is a vacuum chamber) by use of a sputtering source 32. The sputtering source 32 incorporates a target 33 disposed opposing to the substrate 4. In FIG. 12, a DC power source 34, which supplies pulse-shaped sputtering power of about 15 KW at a maximum, is connected to the film deposition apparatus 3. Specifically, the sputtering power is applied across the target 33 and the substrate 4 so as to perform the sputtering process in the film deposition chamber 31, as shown in FIG. 13. Further, a control unit 5 is connected both to the DC power source 34 and the film deposition chamber 3 so as to control a series of sputtering processes.

However, in the above-described conventional sputtering apparatus, there is not provided judging means for immediately judging whether or not the sputtering process in the film deposition apparatus 3 has been normally performed and an aluminum thin film has been satisfactorily deposited on the substrate 4. As shown in FIG. 12, the film deposition apparatus 3 is incorporated in the manufacturing line consisting of the subsequent second handling machine 6 followed by a protective film-forming apparatus 7→a third handling machine 8→an inspection apparatus 9. Thus, the film-deposited substrate 4 will not be inspected until it reaches the final step of the manufacturing line, i.e., the inspection apparatus 9. In the inspection apparatus 9, automatic inspection items are processed which include a function test to automatically judge whether or not the information has been satisfactorily recorded on the CD. However, the items do not include an automatic inspection step to automatically inspect whether or not an aluminum thin film per se has been satisfactorily deposited. Assume that the results of such function test are satisfactory; however, the aluminum thin film per se has uneveness or black stains which damage the appearance of the CD as salable merchandise. In this case, such CD must be removed as a defective product. Therefore, after the completion of the entire manufacturing processes, the finished CDs must undergo the prescribed visual inspection performed by human operators. In other words, even when an aluminum thin film has been unsatisfactorily deposited on the substrate 4 in the film deposition apparatus 3, such defective substrate 4 must pass through the subsequent processes including the protective film formation. This consumes wasteful time in the subsequent processes, and increase the load on the final inspection process. Further, a large number of defective CDs might be produced, which cannot be detected in the final inspection process. As described above, in the conventional sputtering apparatus, judging means are not provided for immediately judging whether or not the prescribed film deposition by sputtering has been satisfactorily performed. Thus, a large number of defective products might be unnecessarily transferred into subsequent processes. This inevitably deteriorates the yield of the products and decreases the efficiency of the manufacturing line.

SUMMARY OF THE INVENTION

Accordingly, one object of the present invention is to provide a sputtering apparatus which includes an abnormality-detecting device for immediately detecting the abnormalities in a sputtering process, whereby the efficiency of the manufacturing line can be significantly increased.

Briefly, in accordance with one aspect of the present invention, there is provided a sputtering apparatus having a vaccum film deposition chamber for depositing a thin film on the surface of a substrate to be processed, a target made of thin film-depositing material, the target being incorporated in the film deposition chamber at a position opposing the substrate to be processed, and a power source for supplying discharge power the substrate to be processed and the target. The improvement of the apparatus comprises a device for determining those conditions necessary for depositing a normal thin film on the surface of the substrate to be processed, a device for detecting the end results of thin film-deposition processes, a device for comparing the end results detected by the end result detecting device with the necessary conditions determined by the condition-determining device, and a device for judging whether or not the thin film-deposition process has been satisfactorily performed on the basis of the comparison results produced from the comparing means.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a diagram illustrating the configuration of a manufacturing line in which a first embodiment of a sputtering apparatus according to the present invention has been employed;

FIG. 8 is a characteristic diagram illustrating the discharge power for sputtering in a third embodiment of a sputtering apparatus according to the present invention;

FIG. 10 is a characteristic diagram illustrating the discharge power for sputtering in a fourth embodiment of a sputtering apparatus according to the present invention;

FIG. 12 is a diagram illustrating the configuration of a conventional manufacturing line in which CDs are manufactured.

DESCRIPTION OF THE PREFERRED EMBODIMENTS

Figure 13:
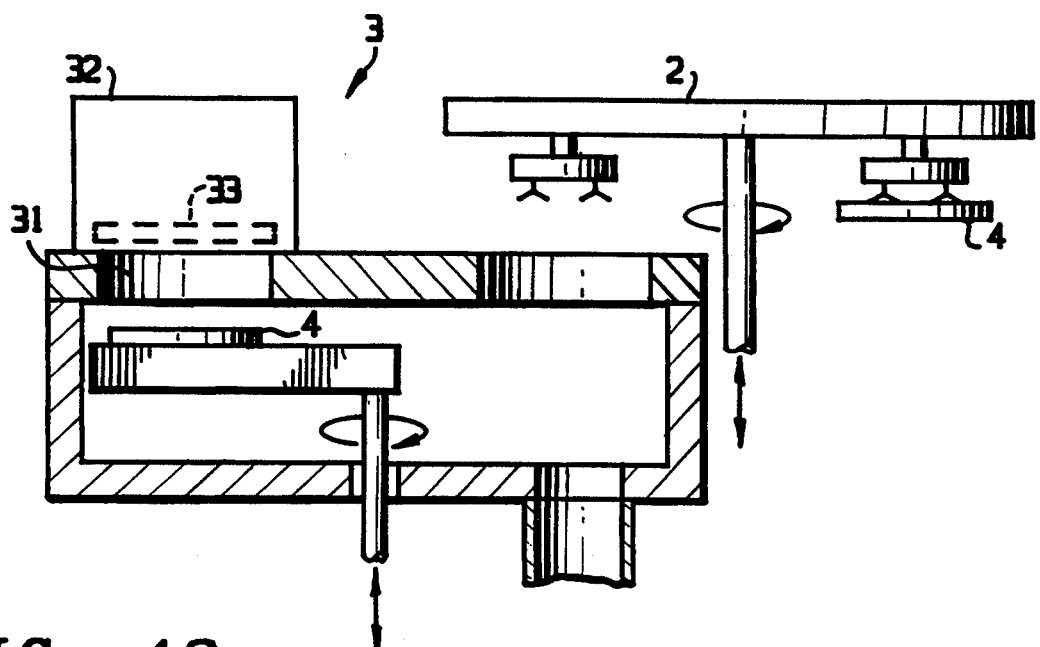
FIG. 13 is an enlarged cross-sectional view of the film deposition apparatus shown in FIG. 12.

Hereinafter, several embodiments of a sputtering apparatus according to the present invention will be described with reference to the accompanying drawings, wherein like reference numerals designate identical or corresponding parts in the conventional apparatus shown in FIG. 12 and FIG. 13, whereby the detailed description thereof will be partially omitted.

FIG. 1 is a diagram illustrating the configuration of a manufacturing line in which a first embodiment of a sputtering apparatus according to the present invention has been employed. In FIG. 1, digital information of "1" or "0" is recorded on a substrate 4, which is made of synthetic resin, by use of a press-molding technique in a molding apparatus 1. The thus information-recorded substrate 4 is transferred by a first handling machine 2 into a film deposition apparatus 3. The film deposition apparatus 3 comprises a vacuum chamber in which an aluminum target 33 and the substrate 4 are disposed opposing to each other in the same manner as in the conventional apparatus. In the film deposition apparatus 3, an aluminum light-reflecting film is deposited on the surface of the substrate 4 by use of discharge power which is supplied from a power source 34 to the target 33. Further, a control unit 5 is connected both to the film deposition apparatus 3 and the power source 34. The control unit 5 comprises judging means 51 which is more specifically illustrated in FIG. 2.

Figure 2:
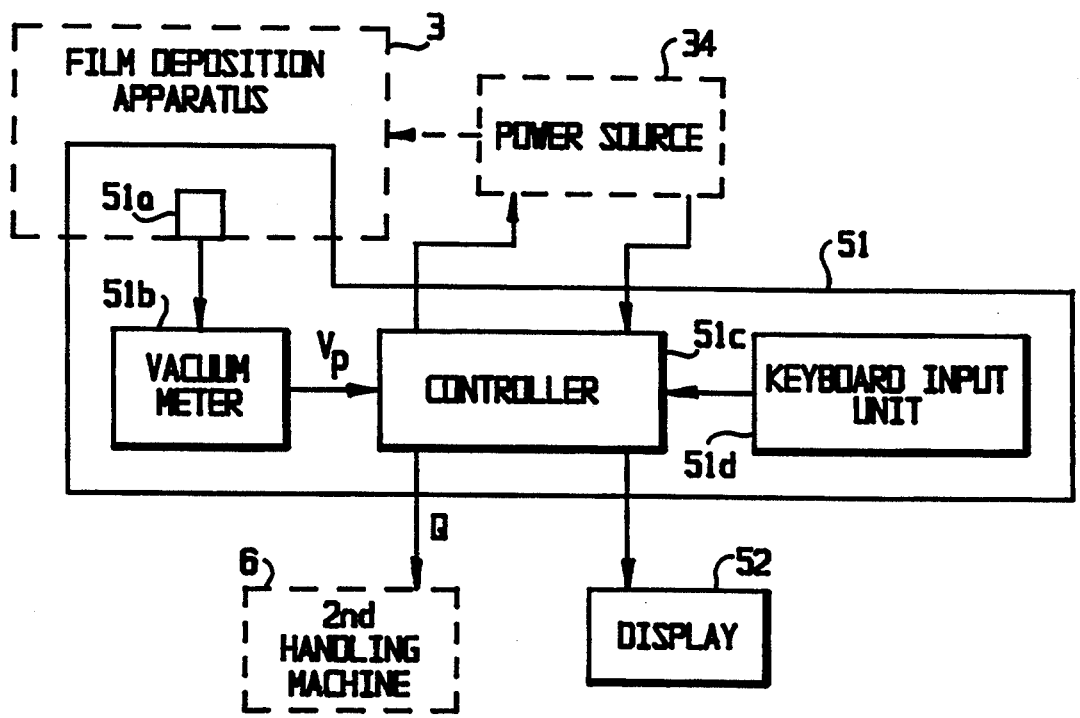
FIG. 2 is a block diagram illustrating an essential portion of the apparatus shown in FIG. 1.

In FIG. 2, a vacuum-sensing head 51a is provided in a film deposition chamber 31 (a vacuum chamber) of the film deposition apparatus 3. The pressure information in the film deposition chamber 31 is fed into a vacuum meter 51b so as to be converted into a voltage signal Vp corresponding to the pressure in the film deposition chamber 31. The voltage signal Vp is fed into a controller 51c which is a microcomputer. In accordance with the programmed control, the controller 51c judges whether or not the pressure in the film deposition chamber 31, detected by the vacuum-sensing head 51a, has been a pressure necessary for the normal film deposition process. When this necessary pressure has not been present in the film deposition chamber 31, the controller 51c detects the abnormalities in sputtering. The thus detected result is fed into a second handling machine 6. As a result, the corresponding substrate 4 can be removed as a defective substrate from the second handling machine 6. Further, the removal of the defective substrate 4 is displayed on a display 52. A keyboard input unit 51d serves to determine the reference pressure value for the normal film deposition process, and to feed it into the controller 51c. The above-mentioned judgment result is outputted as signals corresponding to the eace substrate to be inspected.

Specifically, the second handling machine 6 removes the corresponding defective substrate 4 therefrom on the basis of a removal signal Q (which instructs to remove a substrate having a defective thin film deposited thereon) produced from the judging means 51. Thus, only the substrate 4, on which an aluminum thin film has been satisfactorily deposited by the normal sputtering process, can be transferred into a protective film-forming apparatus 7. In the apparatus 7, a synthetic resin protective film is formed on the aluminum film-deposited surface of the thus transferred substrate 4.

In the manufacturing line starting with the molding apparatus 1 through an inspection apparatus 9, the film deposition apparatus 3 is the most essential apparatus of all. Specifically, in the molding apparatus 1, the substrates are manufactured by use of a press-molding technique. Thus, the substrates of uniformed quality can be relatively easily obtained, i.e., few substrates having a defective molded shape are produced. Further, in the protective film-forming apparatus 7, synthetic resin is simply painted on the aluminum film-deposited surface of the substrates, and hardened by ultraviolet rays applied thereto. Thus, also in this process, the rate of producing defective substrates is relatively low. However, in the film deposition apparatus 3, complicated and accurately controlled processes are repeatedly performed in a sheet-by-sheet mass-production manner. Such complicated processes include: transferring substrates into the vacuum chamber followed by exhaust by use of a turbo molecule pump→discharge (sputtering process) followed by transferring substrates to the outside. Thus, the rate of producing defective substrates is the highest throughout the processes in the manufacturing line. In the first embodiment according to the present invention, the judging means 51 is provided in the control unit 5. The judging means 51 can immediately judge whether or not an aluminum thin film has been satisfactorily deposited on an individual substrate. The second handling machine 6 receives the judgment result from the judging means 51 in the control unit 5. Thus, the defective substrate can be removed from the second handling machine 6. As a result, the load on the inspection apparatus 9 can be reduced, and wasteful time, in which a protective film is formed on the defective substrate, can be eliminated.

Figure 3:
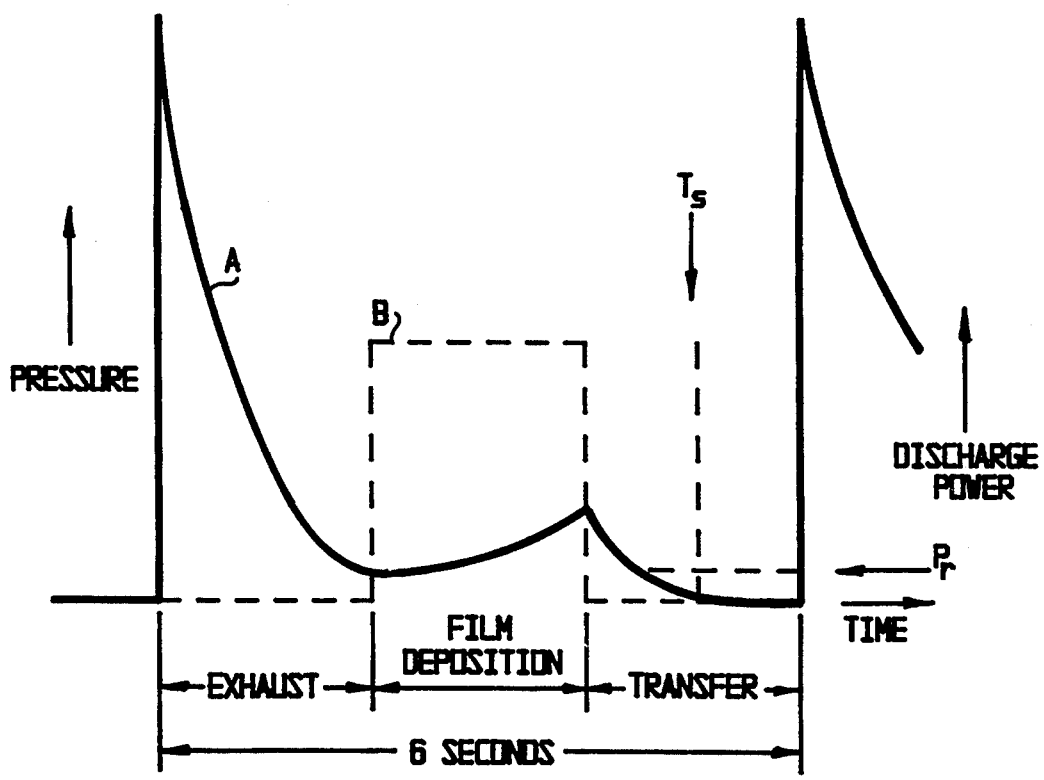
FIG. 3 is a characteristic diagram illustrating the pressure and discharge power during the period of a single sputtering process for film deposition in the apparatus shown in FIG. 1.

More specifically, a single film deposition process, which includes exhaust followed by film deposition (sputtering process) followed by transfer, is performed in a short-period of about 6 seconds, as shown in FIG. 3. In FIG. 3, the solid line A represents pressure in the film deposition chamber 31, and the dotted line B represents DC power applied across the target 33 and the substrate 4. An aluminum thin film is satisfactorily deposited on the substrate 4 only when the pressure A in the film deposition chamber 31 has been sufficiently decreased by exhaust. Thus, in general, the DC power B for sputtering is applied only after the sufficient decrease of the pressure A has been confirmed. In other words, the pressure in the film deposition chamber 31 must be detected immediately before the sputtering. This is disadvantageous to the reduction of the sheet-by-sheet processing time. Thus, in this embodiment, the pressure in the film deposition chamber 31 is detected at a time after the film deposition, i.e., at a time during the transferring period. When the thus detected pressure value is equal to or less than a predetermined reference value, the judging means 51 recognizes that a satisfactory film deposition process has been performed under the normal pressure.

Figure 4:
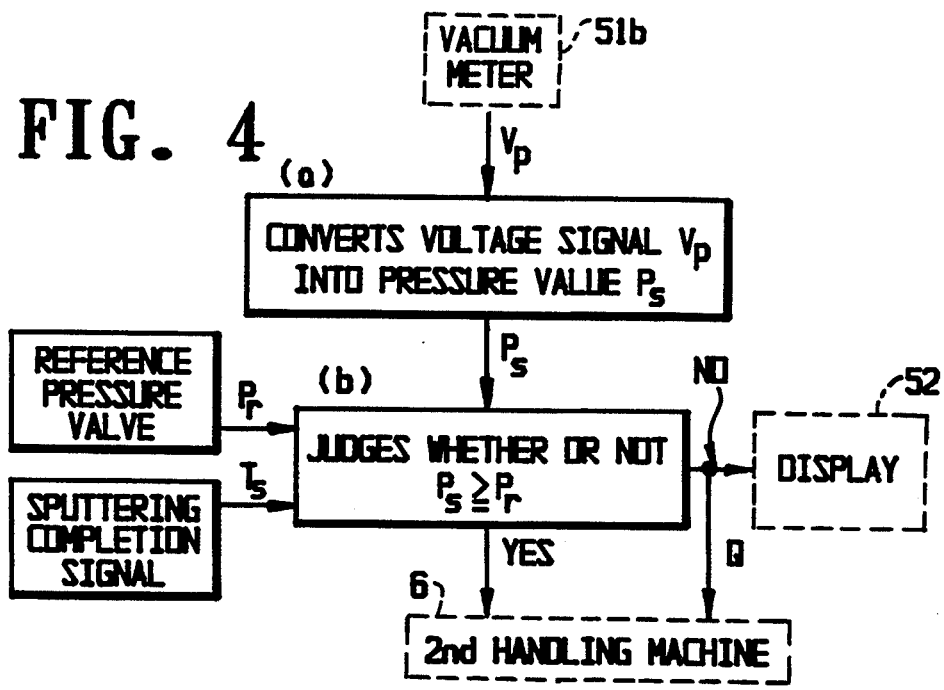
FIG. 4 is a flow chart illustrating the operation procedures in the apparatus shown in FIG. 1.

The controller 51c, which is a microcomputer incorporated in the judging means 51, derives a sputtering completion signal Ts at a time after the sputtering film deposition process, i.e., at a time during the transferring period. Previously, an allowable maximum pressure value Pr [Pa] at the time upon the occurrence of the signal Ts has been fed into the controller 51c as a reference value by use of the keyboard input unit 51d. The judgment as to whether or not the prescribed film deposition process has been satisfactorily performed is executed in accordance with the following simple procedures shown in FIG. 4.

In STEP (a), the procedure converts a voltage signal Vp (e.g., in a range of 0 v through 11 v) produced from the vacuum meter 51b into a pressure value Ps [Pa]. In STEP (b), the procedure compares the detected pressure value Ps [Pa] with the reference pressure value Pr [Pa], and judges whether or not Ps≦Pr. This comparison is made at the time upon the occurrence of the sputtering completion signal Ts in very film deposition processes. When Ps≦Pr, the procedure recognizes that the prescribed film deposition process has been satisfactorily performed. However, when Ps>Pr, the procedure recognizes that the corresponding substrate 4 is defective in terms of the film deposition. In this case, the procedure produces an abnormality-indicating signal corresponding to the each substrate to be inspected and also indicates this on the display 52. Further, the procedure feeds the removal signal Q into the second handling machine 6. As a result, the corresponding defective substrate 4 can be removed from the second handling machine 6.

As described above, the sputtering apparatus according to this embodiment comprises the judging means 51 that can judge whether or not the prescribed film deposition process has been satisfactorily performed. This judgment is made on the basis of whether or not the pressure in the film deposition chamber has been normal value during the film deposition period. Thus, the corresponding defective substrate can be removed from the manufacturing line at the earliest possible step, i.e., from the second handling machine 6. As a result, the load of the final inspection apparatus 9 in the manufacturing line can be reduced. Further, the wasteful processes including the protective film-formation with respect to the defective substrates can be avoided. Therefore, the efficiency of the manufacturing line can be significantly enhanced.

In the above-described first embodiment according to the present invention, the condition, in which a substrate having a defective film deposited thereon is produced, has been defined as the case when the film deposition process has been performed under the abnormal pressure. However, the defective film deposition or the damage to the pits can also occur in the case when the waveform of discharge power (voltage or current), being applied in a pulse-shaped manner during the film deposition process, has not been in a prescribed normal shape. Thus, the abnormalities in sputtering can also be detected by the detection of the abnormal waveform of such discharge power (voltage or current).

Figure 6:
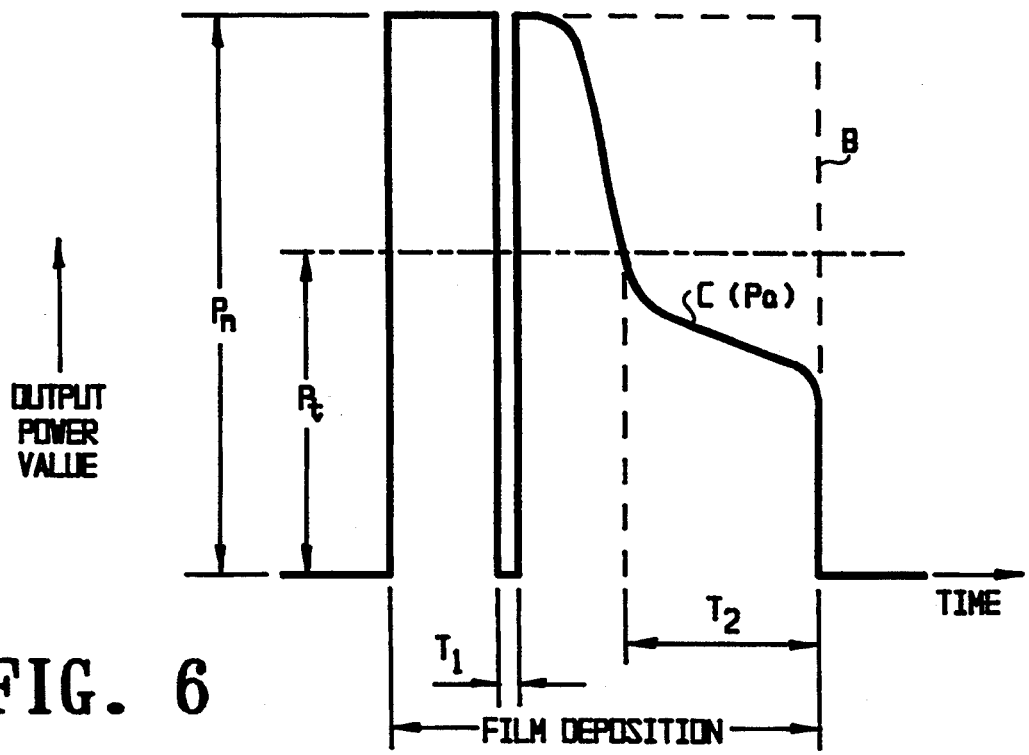
FIG. 6 is a characteristic diagram illustrating the discharge power during the period of a single sputtering process for film deposition in the apparatus shown in FIG. 5.
Figure 5:
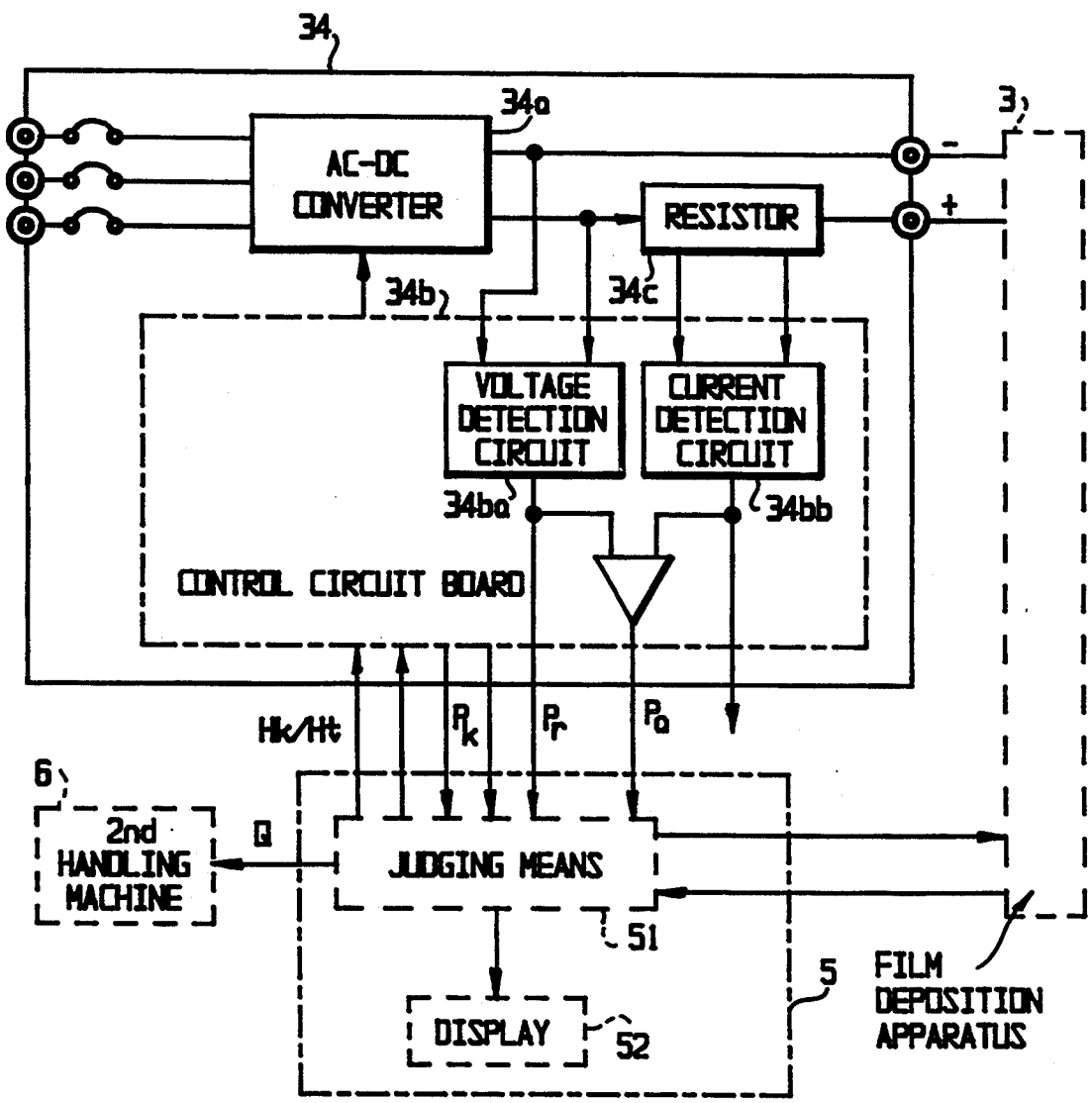
FIG. 5 is a block diagram illustrating an essential portion of a second embodiment of a sputtering apparatus according to the present invention.
Figure 7:
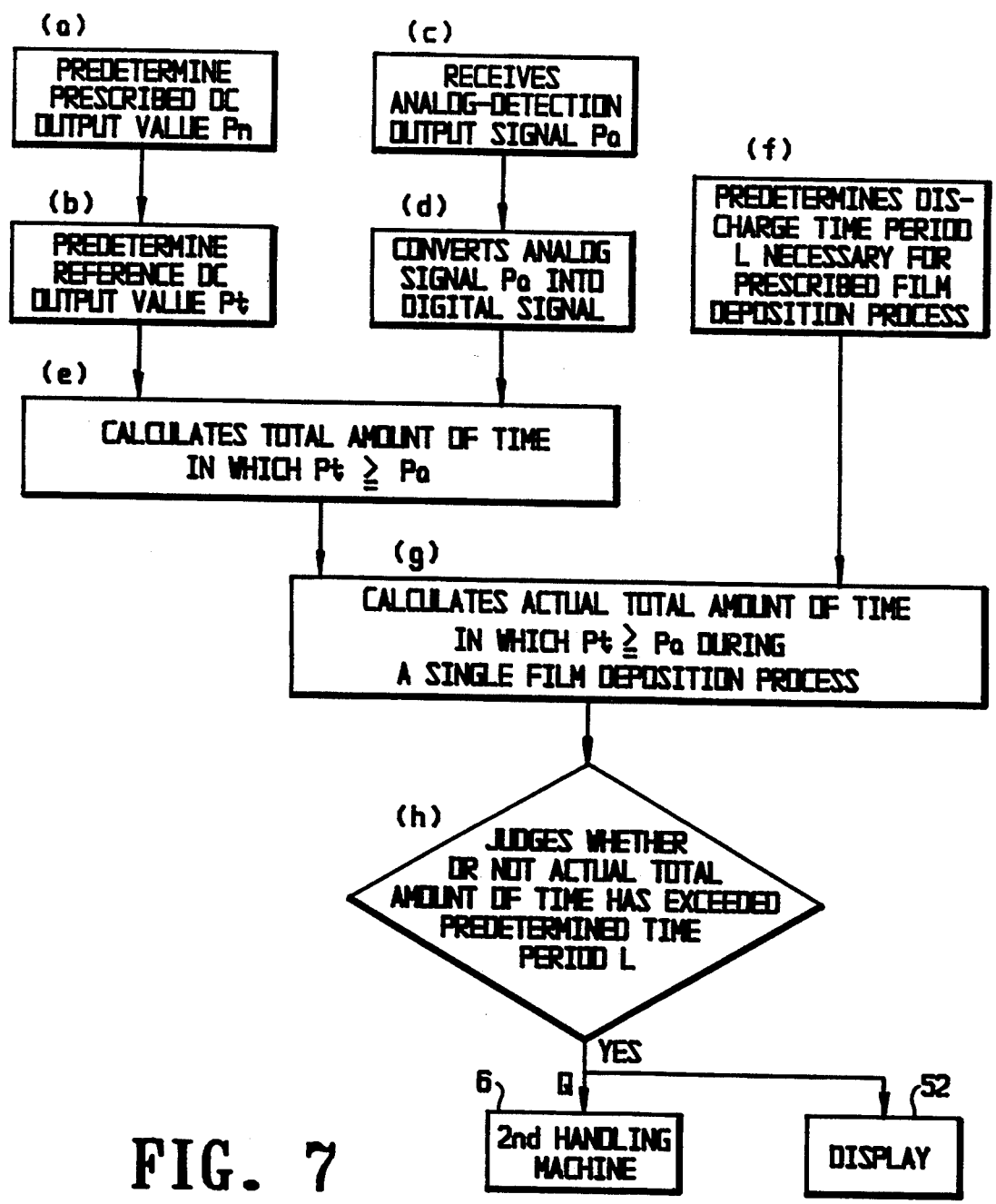
FIG. 7 is a flow chart illustrating the operation procedures in the apparatus shown in FIG. 5.

Next, a second embodiment of a sputtering apparatus according to the present invention will be described with reference to FIG. 5 through FIG. 7. In this embodiment, when the discharge power waveform has not been normal, i.e., when the sufficient discharge power necessary for the normal film deposition process has not been applied, the apparatus produces an abnormality-indicating signal corresponding to the each substrate to be inpected which indicates that a defective substrate has been produced in the film deposition process. The entire manufacturing line, in which this embodiment of the sputtering apparatus has been employed, has the same configuration as that shown in FIG. 1 and FIG. 2. However, the power source 34 has a configuration shown in FIG. 5. In FIG. 5, the power source 34 receives 3-phase AC power, and converts the same into high-voltage DC power by use of an AC-DC converter 34a incorporated therein. The thus converted high-voltage DC power is supplied to the film deposition apparatus 3. The AC-DC converter 34a produces the DC power output in accordance with an output timing signal supplied from a control circuit board 34b. The output timing signal has been appropriately determined so as to perform the prescribed film deposition process. Further, a DC output power value Pa and a DC output voltage value Pr, which represent the converted output, are detected by use of a combination of components such as a resistor 34c, a voltage detection circuit 34ba and a current detection circuit 34bb. The thus detected values Pa and Pr are fed into the judging means 51 in the control unit 5. Thus, the judging means 51 can judge whether or not the prescribed film deposition process has been satisfactorily performed. Moreover, the power source 34 produces a spark signal Pk upon the detection of that an are discharge (abnormal discharge) has occurred during the sputtering process instead of a glow discharge (normal discharge). The spark signal Pk is also fed into the judging means 51 in the control unit 5, as shown in FIG. 5.

The judging means 51 feeds a discharge starting signal Hk and a discharge-stop controlling signal Ht into the power source 34. The power source 34 then feeds an analog-detection output signal (Pa) corresponding to its output DC power into the judging means 51. In FIG. 6, the rectangular waveform indicated by the dotted line B represents the prescribed DC output power to achieve the satisfactory film deposition. Assume that the analog-detection output signal (Pa) has a waveform indicated by the solid line C. This represents that the prescribed DC output power has not been supplied to the film deposition apparatus 3. Specifically, the total amount of times T1 and T2, in which the discharge power has not reached a minimum output power value Pt during a single sputtering process, has exceeded a predetermined constant time period L. In this case, the judging means 51 recognizes that the prescribed discharge power necessary for the normal film deposition process has not been supplied, and judges that the prescribed film deposition process has not been satisfactorily performed, and then feeds an abnormality-detection signal Q corresponding to the each substrate to be inspected into the second handling machine 6. Thus, a corresponding substrate having a defective thin film deposited thereon can be removed from the second handling machine 6.

The programmed control procedures with respect to the above-described operations in the judging means 51 will be described with reference to a flow chart shown in FIG. 7. In STEP (a) and in STEP (b), the procedure respectively predetermines a prescribed DC output value Pm and a reference DC output value Pt. In STEP (c), the procedure receives the analog-detection output signal Pa from the power source 34. In STEP (d), the procedure converts the thus received analog signal Pa into a digital signal. In STEP (e), the procedure calculates the total amount of time in which $Pt \geq Pa$, i.e., the cause to prevent the normal film deposition process. In STEP (f), the procedure predetermines the discharge time period L necessary for the prescribed film deposition process. In STEP (g), the procedure calculates an actual total amount of time in which $Pt \geq Pa$ during a single film deposition process. In STEP (h), the procedure judges whether or not the thus calculated actual total amount of time has exceeded the predetermined time period L. In the case of YES, the procedure then produces an abnormality-detection signal Q, and feeds it to the second handling machine 6. Further, the procedure indicates this abnormality on the display 52. Therefore, when the above-described second embodiment is employed in a series of manufacturing line processes, a substrate having a defective thin film deposited thereon can be removed from the line at the earliest possible step, i.e., at the second handling machine 6. This can be performed in the same manner as in the first embodiment. Thus, the load on the final inspection apparatus 9 can be reduced, and the wasteful processes in the line with respect to the defective substrates can be avoided.

Moreover, there can be provided another technique to judge whether or not the prescribed film deposition process has been satisfactorily performed on the basis of the detection results of whether or not the normal discharge has been performed during the film deposition process. Specifically, the technique is such that the total amount of time, in which the instantaneous discharge interruption (caused by arc discharge and the like) has occurred during a single film deposition process, is compared with a predetermined allowable time. Further, when the total amount of time has exceeded the predetermined allowable time, the judging means 51 recognizes that the prescribed film deposition process has not been satisfactorily performed. The judging means 51 then produces an abnormality-detection signal. This technique is useful because even the instantaneous discharge interruption would have some adverse effect on the film deposition process which is performed in an extremely short period of about 2 seconds.

Figure 9:
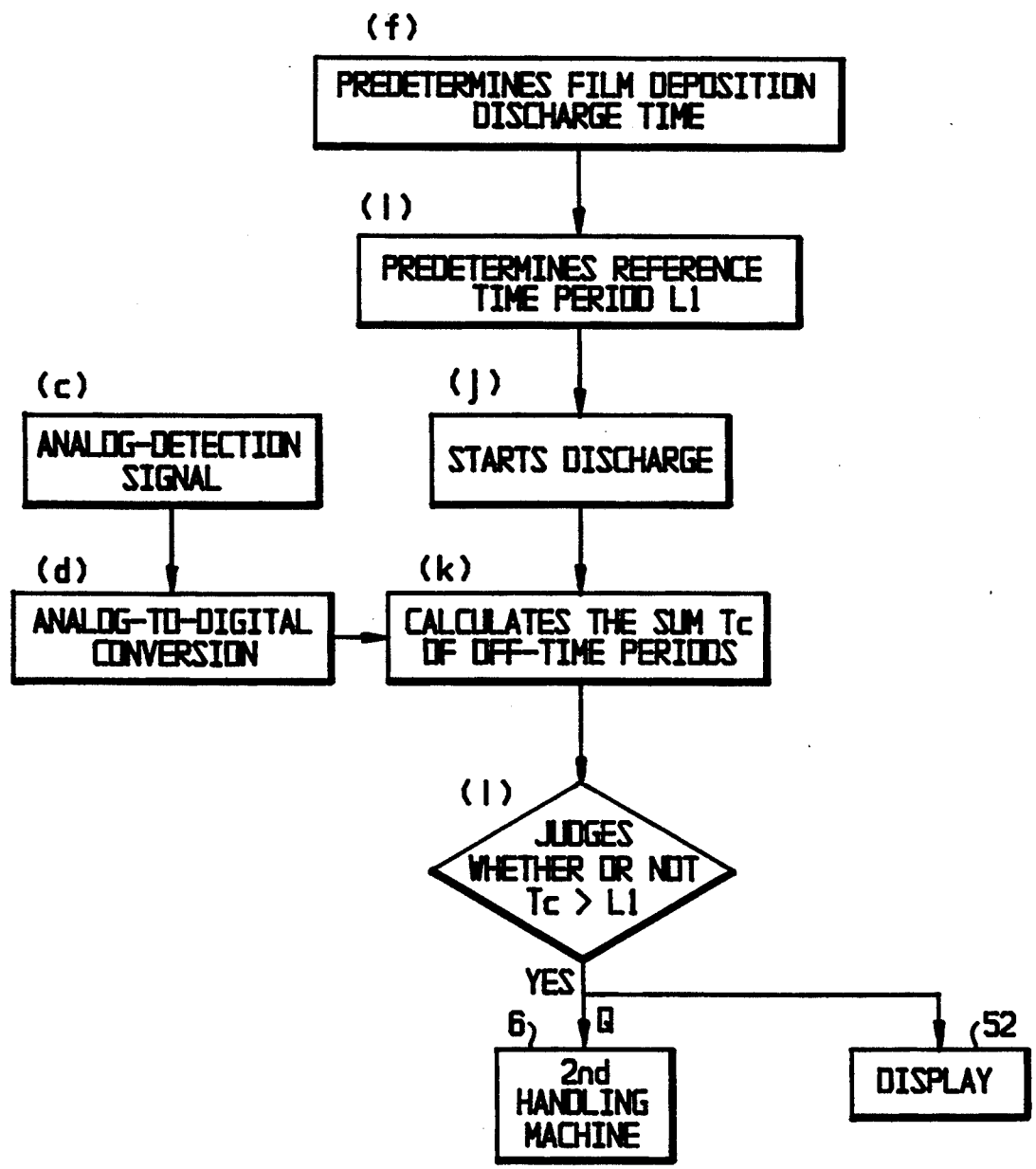
FIG. 9 is a flow chart illustrating the operation procedures in the apparatus shown in FIG. 8.

Next, a third embodiment of a sputtering apparatus according to the present invention, in which the above-described technique is utilized, will be described with reference to FIG. 8 and FIG. 9. FIG. 8 shows the waveform of the discharge power, and FIG. 9 shows the programmed procedures in the judging means 51. In FIG. 8, T3 and T4 respectively represent the times in which the instantaneous discharge interruption has occurred during a single film deposition process. The judging means 51 compares the total amount of such times, i.e., Tc=T3+T4, with a predetermined reference time period L1, and judges whether or not Tc>L1. When Tc>L1, the judging means 51 then produces an abnormality-detection signal Q indicating that the entire normal discharge power has been insufficient for the satisfactory film deposition process. The programmed procedures shown in FIG. 9 are substantially the same as those in the second embodiment shown in FIG. 7, so that the detailed description thereof will be omitted. In FIG. 9, the procedure predetermines the reference time period L1 (STEP(i)), and starts the discharge (STEP (j)). Thereafter, the procedure calculates the total amount of time, Tc=T3+T4 (STEP (k)). In STEP (1), the procedure judges whether or not Tc>L1. When Tc>L1, the procedure recognizes that the prescribed film deposition process has not been satisfactorily performed, and produces the abnormality-detection signal Q, which is fed into the second handling machine 6. Thus, a substrate having a defective thin film deposited thereon can be removed from the second handling machine 6. Further, the procedure indicates such abnormality on the display 52.

Moreover, assume that the number of times of instantaneous discharge interruptions (caused by arc discharge and the like) in a single film deposition process has exceeded a predetermined allowable number. In this case, a prescribed thin film cannot be satisfactorily deposited on the surface of a substrate, and the pits formed thereon might be damaged. This phenomenon occurs because of the fact that the excessive number of times of instantaneous discharge interruptions causes aluminum to be scattered in massive particles from the parts such as an aluminum target, a protective shield and the like. Upon the detection of the excessive number of times of instantaneous discharge interruptions, the judging means 51 recognizes that unsatisfactory film deposition process has been performed, and produces an abnormality-detection signal.

Figure 11:
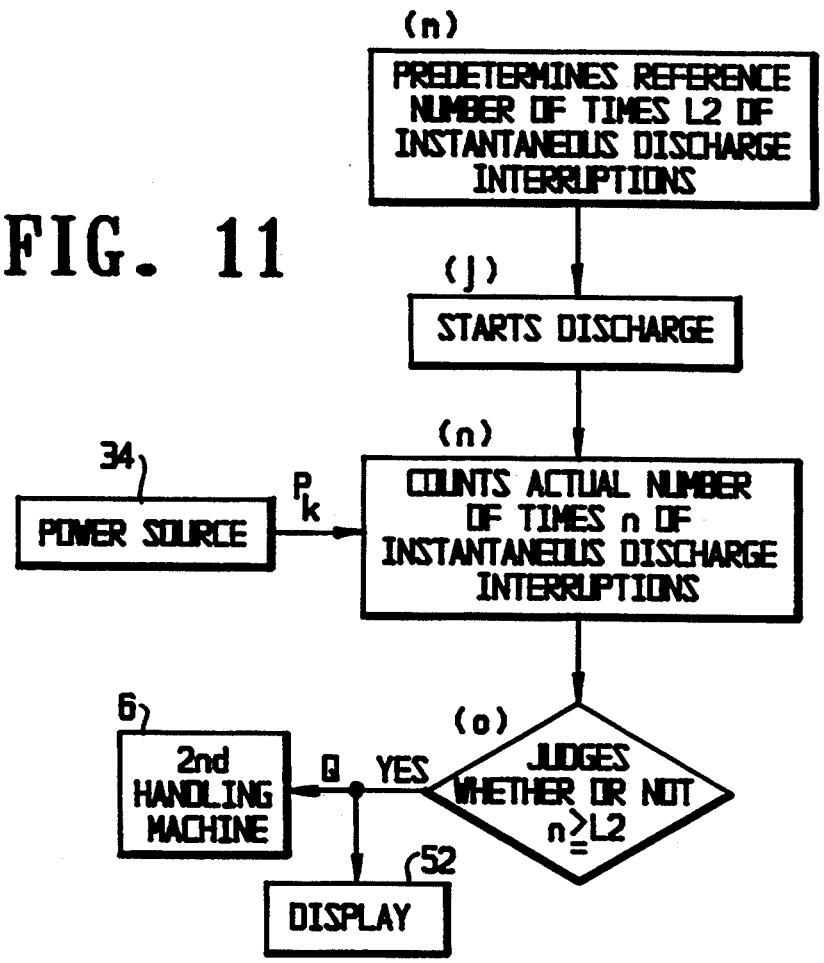
FIG. 11 is a flow chart illustrating the operation procedures in the apparatus shown in FIG. 10.

Next, a fourth embodiment of a sputtering apparatus according to the present invention, in which the above-described phenomenon has been taken into consideration, will be described with reference to FIG. 10 and FIG. 11. FIG. 10 shows the waveform of the discharge power, and FIG. 11 shows the programmed procedures in the judging means 51. In FIG. 10, instantaneous discharge interruptions (caused by spark) have occurred five times (t1 through t5) during a single film deposition process. The judging means 51 counts the number of times of the instantaneous discharge interruptions, and compares the thus counted number n with a predetermined reference number of times L2. When n>L2, the judging means 51 then produces an abnormality-detection signal Q because of that the damage to the surface of the substrate 4 cannot be neglected even when the entire discharge power has been sufficient to achieve the prescribed film deposition process. In FIG. 11, the procedure predetermines the reference number of times of instantaneous discharge interruptions (STEP (m)).

After the discharge has been started, several spark signals Pk (indicating the occurrence of instantaneous discharge interruptions) are produced from the power source 34. The procedure counts the number of times n of the instantaneous discharge interruptions on the basis of the thus produced spark signals Pk (STEP (n)). The procedure judges whether or not the thus counted number n is greater than or equal to the reference number L2. When $n \geq L2$, the procedure then produces an abnormality-detection signal Q, and feeds it both to the second handling machine 6 and the display 52 (STEP (o)).

In the above-described first through fourth embodiments, the power source 34 has been described as the DC power source. However, the power source 34 can also be replaced with a high frequency power source. In this case, the same advantages as those in the above-described embodiments can also be obtained. Further, in the second through fourth embodiments, the waveform of the output power Pa has been utilized to judge whether or not the prescribed film deposition process has been satisfactorily performed. However, the waveform of the output voltage Pr may also be utilized for the same judgment. Moreover, the abnormality-detection signal Q may also be fed into the third handling machine 8. Further, in the respective above-described embodiments, various parameters, which are discharge power, discharge interruption time, the number of times of arc discharges and the discharge voltage value or the discharge current value, are independently and individually detected to be utilized as the basis of the abnormality-detection of the sputtering process. However, such parameters may also be appropriately selected so as to make a combination thereof, or all of the parameters may also be provided in the apparatus. Namely, in some cases, all of the above-described embodiments can be incorporated in the sputtering apparatus, the abnormality detection of the sputtering film deposition process can be performed either on the basis of a parameter of any one of the embodiments, or on the basis of a combination of plural parameters of the embodiments incorporated in the apparatus.

As described above, according to the present invention, there can be provided a sputtering apparatus that can judge, immediately after the completion on a film deposition process, whether or not the film deposition process has been satisfactorily performed, and can produce an abnormality-detection signal. Thus, when the sputtering apparatus of this invention is incorporated in a mass-production manufacturing line, a substrate having a defective film in terms of function and/or appearance, which cannot be detected by the conventional inspection apparatus, can be removed from the line at the earliest possible step. This is significantly advantageous, and contributes much to the improvement of the efficiency of the manufacturing line. The apparatus of this invention can also be utilized even for a single sputtering process, i.e., a sputtering apparatus for various objects such as a glass plate, a metal plate, plastics and the like. The sputtering apparatus according to the present invention having a simple configuration can assuredly detect the abnormalities in the film deposition process with respect to an individual substrate at the earliest possible step in the continuous manufacturing line. Thus, the apparatus is significantly advantageous to the practical applications.

Obviously, numerous additional modifications and variations of the present invention are possible in light of the above teachings. It is therefore to be understood that within the scope of the appended claims, the invention may be practiced otherwise than as specifically described herein.

What is claimed is:

1. Continuous successive substrate sputtering apparatus comprising:

a vacuum film deposition chamber for depositing a thin film on the surface of each one of successive substrates to be processed at a reduced pressure;

a target of film-deposition material, being incorporated in said film deposition chamber at a position opposing said substrate to be processed;

a power source for supplying discharge power between said substrate to be processed and said target;

means for determining a set of conditions including a predetermined pressure value, a total discharge power value, and a discharge time period, as are necessary for depositing a normal thin film on the surface of said substrates to be processed;

means for detecting a set of results of said predetermined pressure value and said total discharge power value in said discharge time period which corresponds to each one of said successive substrates;

means for comparing the set of results corresponding to each one of said successive substrates transferred from said deposition chamber as detected by said means for detecting; and means for i) determining if said thin film-deposition process has been satisfactorily performed on each one of said successive substrates, and for ii) producing a removal signal to cause removal of an individual one of said substrates as a defective product before further processing, on the basis of comparison results from said comparing means.

2. The continuous successive sputtering apparatus of claim 1, wherein said means for determining a set of conditions further includes a reference pressure value device in said film deposition chamber, and said detecting means is adapted for detecting a pressure value in said film deposition chamber during a film deposition process.

3. The continuous successive sputtering apparatus of claim 1, wherein said means for determining a set of conditions is adapted for determining the necessary time period of a prescribed discharge power value, and said means for detecting is adapted for detecting a total amount of discharge time in which a discharge power value has not reached said prescribed discharge power value.

4. The continuous successive sputtering apparatus of claim 1, wherein said means for determining a set of conditions is adapted for determining an allowable time period of discharge interruption, and said means for detecting is adapted for detecting a time period of discharge interruption.

5. The continuous successive sputtering apparatus of claim 1, wherein said means for determining a set of conditions is adapted for determining an allowable number of arc discharges, and said means for determining is adapted for detecting a number of said arc discharges.

6. The continuous successive sputtering apparatus of claim 1, wherein said means for determining a set of conditions is adapted for determining a necessary time period of a prescribed discharge voltage value, and said means for detecting is adapted for detecting a total amount of a discharge time period in which a discharge voltage value has not reached said prescribed discharge voltage value.

7. The continuous successive sputtering apparatus of claim 1, wherein said means for determining a set of conditions is adapted for determining a necessary time period of a prescribed discharge current value, and said means for detecting is adapted for detecting the total amount of discharge time period in which the discharge current value has not reached said prescribed discharge current value.

8. The continuous successive sputtering apparatus of claim 1, wherein said means for determining conditions is adapted for determining the necessary minimum time period of a prescribed discharge power value.

9. The continuous successive sputtering apparatus of claim 1, wherein said means for detecting is adapted for detecting a total amount of discharge time in which a discharge power value has not reached said prescribed discharge power value within a fixed cycle time.

10. A continuous successive sputtering apparatus having a pressure-reduced film deposition chamber for depositing a thin film on the surface of each one of successive substrates to be processed, comprising:
- a target made of thin film-depositing material, incorporated in said film deposition chamber at a position opposing to said substrate to be processed, a power source for supplying a discharge power value across said substrate to be processed and said target, first determining means for determining a reference pressure value in said film deposition chamber which is necessary for depositing a normal thin film on the surface of each successive substrate to be processed;
- second determining means for determining a necessary time period of a prescribed discharge power value which is necessary for depositing a normal thin film on the surface of each successive substrate to be processed;
- third determining means for determining allowable time periods of discharge interruption which permits depositing a normal thin film on the surface of each successive substrate to be processed;
- fourth determining means for determining the allowable number of times of arc discharges which permits depositing a normal thin film on the surface of each successive substrate to be processed;
- fifth determining means for determining the necessary time period of a prescribed discharge voltage value which is necessary for depositing a normal thin film on the surface of each successive substrate to be processed;
- sixth determining means for determining the necessary time period of a prescribed discharge current value which is necessary for depositing a normal thin film on the surface of each successive substrate to be processed;
- first detecting means for detecting the executed pressure value during the sputtering process;
- second detecting means for detecting the total discharge time period in which the discharge power value has not reached said prescribed discharge power value;
- third detecting means for detecting the time periods of discharge interruption;
- fourth detecting means for detecting the number of times of arc discharges;
- fifth detecting means for detecting the total discharge time period in which the discharge voltage value has not reached said prescribed discharge voltage value;
- sixth detecting means for detecting the total discharge time in which discharge current value has not reached said prescribed discharge current value;
- first comparing means for comparing the results detecting said first detecting means with the conditions determined by said first determining means;
- second comparing means for comparing the results detected by said second detecting means with the conditions determined by said second determining means;
- third comparing means for comparing the results detected by said third detecting means with the conditions determined by said third determining means;
- fourth comparing means for comparing the results detected by said third detecting means with the conditions determined by said third determining means;
- fourth comparing means for comparing the results detected by said fourth detecting means with the conditions determined by said fourth determining means;
- fifth comparing means for comparing the results detected by said fifth detecting means with the conditions determined by said fifth determining means;
- sixth comparing means for comparing the results detected by said sixth detecting means with the conditions determined by said sixth determining means; and
- means for determining for each successive substrate if a prescribed film deposition process has been satisfactorily performed on the basis of at least one of the comparison results produced from said first through sixth means for comparing, and for producing a removal signal to cause removal of an individual one of said substrates as a defective product before further processing, on the basis of comparison results from said comparing means.

11. Continuous successive substrate sputtering apparatus comprising:
- a vacuum film deposition chamber for depositing during a fixed cycle of predetermined time a thin film on the surface of each one of successive substrates to be processed;
- a target of film-deposition material, being incorporated in said film deposition chamber at a position opposing said substrate to be processed;
- a power source for supplying discharge power between said substrate to be processed and said target;
- means for determining a set of conditions including a predetermined pressure value, a total discharge power value, and a fixed discharge time period, as are necessary for depositing a normal thin film on the surface of said substrates to be processed in a deposition step;
- means for detecting a set of results of said predetermined pressure value and said total discharge power value in said fixed discharge time period which corresponds to each one of said successive substrates;
- means for comparing the set of results corresponding to each one of said successive substrates transferred from said deposition chamber as detected by said means for detecting;

means for removing selected substrates directly following the deposition step; and means for i) determining if said thin film-deposition process has been satisfactorily performed on each one of said successive substrates within said fixed cycle time, and for ii) producing a removal signal to cause removal of an individual one of said substrates by said means for removing as a defective product before further processing, on the basis of comparison results from said comparing means.

12. The continuous successive substrate sputtering apparatus of claim 11, wherein said fixed discharge time is less than about 6 seconds.

* * * * *

UNITED STATES PATENT AND TRADEMARK OFFICE
CERTIFICATE OF CORRECTION

PATENT NO. : 5,336,385
DATED : August 9, 1994
INVENTOR(S) : SHIMOSE et al.

It is certified that error appears in the above-indentified patent and that said Letters Patent is hereby corrected as shown below:

<u>IN THE TITLE PAGE</u>:

Item [73] Assignee should be: --Kabushiki Kaisha Shibaura Seisakusho; Sony Corporation--

Signed and Sealed this

Twenty-third Day of September, 1997

Attest:

BRUCE LEHMAN

Attesting Officer

Commissioner of Patents and Trademarks